(12) United States Patent
Fujii et al.

(10) Patent No.: US 6,653,884 B2
(45) Date of Patent: Nov. 25, 2003

(54) INPUT INTERFACE CIRCUIT FOR SEMICONDUCTOR INTEGRATED CIRCUIT DEVICE

(75) Inventors: Hiroshi Fujii, Aichi-ken (JP); Hideaki Ishihara, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/915,390

(22) Filed: Jul. 27, 2001

(65) Prior Publication Data

US 2002/0017940 A1 Feb. 14, 2002

(30) Foreign Application Priority Data

Jul. 28, 2000 (JP) ......................................... 2000-229113

(51) Int. Cl.[7] .............................. H03K 5/08; H03L 5/00
(52) U.S. Cl. ...................... 327/319; 327/327; 327/333
(58) Field of Search ................................. 327/309, 310, 327/315, 318–321, 327, 328, 331, 333; 361/91.5

(56) References Cited

U.S. PATENT DOCUMENTS

| | | | |
|---|---|---|---|
| 5,349,227 A | 9/1994 | Murayama | 257/361 |
| 5,378,943 A | 1/1995 | Dennard | 326/68 |
| 5,525,933 A | 6/1996 | Matsuki et al. | 327/309 |
| 6,046,480 A | 4/2000 | Matsumoto et al. | 257/355 |
| 6,081,152 A * | 6/2000 | Maley | 327/320 |
| 6,137,339 A * | 10/2000 | Kibar et al. | 327/333 |

FOREIGN PATENT DOCUMENTS

| | | |
|---|---|---|
| JP | A-5-63540 | 3/1993 |
| JP | A-5-121670 | 5/1993 |
| JP | A-5-144271 | 6/1993 |
| JP | A-6-326595 | 11/1994 |
| JP | A-7-240678 | 9/1995 |
| JP | A-10-242401 | 9/1998 |

\* cited by examiner

Primary Examiner—Tuan T. Lam
(74) Attorney, Agent, or Firm—Posz & Bethards, PLC

(57) ABSTRACT

An input interface circuit for a semiconductor integrated circuit device is provided which includes a pair of diodes, first, second, and third PMOSFETs, and first, second, and third NMOSFETs. The diodes serve to clamp a high positive or negative voltage input at a level that is the sum of the power supply voltage and the forward voltage of the diodes or the difference between the ground potential and the forward voltage. The first and second PMOSFETs are connected in series between the power supply and an inside input terminal coupled to an internal circuit element of the semiconductor integrated circuit device. The first and second NMOSFETs are connected in series between ground and the inside input terminal. The third PMOSFET is connected in series between the outside input terminal and a gate of the first PMOSFET. The third NMOSFET is connected in series between the outside input terminal and a gate of the second NMOSFET. The voltage which is intermediate between ground potential and the voltage of the power supply is applied to a gate of each of the first NMOSFET, the second PMOSFET, the third PMOSFET, and the third NMOSFT. This structure serves to protect the circuit elements against an input of an undesirable higher positive or negative voltage to the input interface circuit.

5 Claims, 5 Drawing Sheets

INPUT INTERFACE CIRCUIT FOR SEMICONDUCTOR INTEGRATED CIRCUIT DEVICE

BACKGROUND OF THE INVENTION

1. Technical Field of the Invention

The present invention relates generally to an input interface circuit for a semiconductor integrated circuit device which is designed to protect circuit elements against an undesirable input of voltage higher than that of a power supply.

2. Background Art

FIG. 5 illustrates a typical input interface circuit for an integrated circuit device that uses CMOS logic. The input interface circuit is designed especially for withstanding a high voltage input and has an input terminal 1 coupled with drains of a P-channel MOSFET 2 and an NMOSFET 3. The FETs 2 and 3 are kept at high and low levels, respectively, when the input interface circuit is in service. Parasitic diodes 2a and 3a are provided between a source and a drain of the FET 2 and between a drain and a source of the FET 3 respectively.

To the input terminal 1, gates of a P-channel MOSFET 4 and an NMOSFET 5 are coupled. The FETs 4 and 5 are also coupled at drains thereof with an input terminal of an inverter gate 6 that is an internal element of an IC. A resistor 7 is connected in series with the input terminal 1 and serves as a current limiter.

The parasitic diodes 2a and 3a disposed at the first stage of the input interface circuit work as protective elements for clamping the high voltage applied to the input terminal 1. The FETs 2 and 3 are turned on in response to input of negative and positive surge voltages to the input terminal 1 and work as protective elements for absorbing the surge voltages on a power supply side and a ground side. The FETs 2 and 3 also serve as an output interface when an output signal is supplied to gates thereof from an internal circuit.

The input interface circuit thus constructed may be used in an input circuit of an ECU (Electronic Control Unit) for automotive vehicles. In general, the voltage of a storage battery installed in automotive vehicles is between 12V and 14V. Therefore, in a case of use in an automotive vehicle, the input interface circuit is generally designed to operate on 5V that is provided by the battery voltage. An input signal to the ECU has the voltage equal to the battery voltage. In order to protect the ECU against a high level signal (e.g., +12V signal) inputted to the input terminal 1, the protection circuit made up of the parasitic diodes 2a and 3a works to clamp it at the voltage that is the sum of the power supply voltage and VF (=a forward voltage of the diode 2a). In this condition, a high electric field acts on an oxide layer on the gate of each of the FETs 3 and 5.

Assuming that the voltage of the power supply is 5V, and the forward voltage VF of the diode 2a is 1V, an oxide layer of a gate of a 5V-FET is generally formed, as shown in FIG. 6(a), to have a thickness on the order of 150 angstrom (i.e., 15 nm). The application of 6V (=voltage of power supply+ VF) to the 5V-FET will cause an electric field of 4 MV/cm to be produced which acts on the 5V-FET. The electric field of 4 MV/cm is generally thought of as the limit of service life of an oxide layer. The application of an electric field of more than 4 MV/cm to the oxide layer for a long time may thus cause the oxide layer to break down. In order to avoid this problem, the oxide layer of the gate of each of the FETs 3 and 5 is formed to have a thickness of about 200 angstrom (i.e., 20 nm), as shown in FIG. 6(b), so that an electric field of 3 MV/cm is produced when a voltage of 6V is applied thereto.

However, the formation of FETs whose oxide layers are different from each other on a semiconductor substrate together requires an additional process of increasing the thickness of the oxide layers selectively using a glass mask. Additionally, the difference in thickness between the oxide layers of the FETs will cause threshold voltages to be different from each other, thus requiring an ion implantation process for adjustment of the threshold voltages.

Further, when signals are transmitted between ICs whose ground potentials are different from each other, a negative high voltage may be applied to the input terminal 1, which causes a high electric field to act on the power supply side FETs 2 and 4. The same measures as described above are, thus, required.

SUMMARY OF THE INVENTION

It is therefore a principal object of the invention to avoid the disadvantages of the prior art.

It is another object of the invention to provide a high voltage-withstanding structure of an input interface circuit for a semiconductor integrated circuit device which may be made in simple processes.

According to one aspect of the invention, there is provided an input interface circuit for a semiconductor integrated circuit device. The input interface circuit comprises: (a) a pair of diodes provided between a power supply and an outside input terminal and between the outside input terminal and ground, respectively; (b) a first and a second PMOSFET connected in series between the power supply and an inside input terminal coupled to an internal circuit element of the semiconductor integrated circuit device; (c) a first and a second NMOSFET connected in series between ground and the inside input terminal; (d) a third PMOSFET connected in series between the outside input terminal and a gate of the first PMOSFET; (e) a third NMOSFET connected in series between the outside input terminal and a gate of the second NMOSFET; and (f) an intermediate voltage source applying a voltage which is intermediate between ground potential and a voltage of the power supply to a gate of each of the first NMOSFET, the second PMOSFET, the third PMOSFET, and the third NMOSFT.

In the preferred mode of the invention, the two diodes are parasitic diodes provided by the third NMOSFET and the third PMOSFET.

A fourth PMOSFET is provided which is connected in series with the third PMOSFET between the outside input terminal and the power supply, A fourth NMOSFET is provided which is connected in series with the third NMOSFET between the outside input terminal and ground. The fourth PMOSFET and NMOSFET are kept turned off at all times. The parasitic diodes are coupled in series with the third and fourth PMOSFETs and the third and fourth NMOSFETs, respectively.

A plurality of protective MOSFETs are further provided each of which is coupled at a gate thereof to one of output side terminals thereof. Each of the protective MOSFETs is turned on when a high voltage is applied to a circuit line of the input interface circuit placed in a high impedance state to work to have the high voltage escape to the intermediate voltage source.

The voltage applied to the gates of the PMOSFETs is lower than that to the respective gates of the NMOSFETs.

The input interface circuit also includes a first and a second protective MOSFET. The first protective MOSFET is connected between the outside input terminal and the power supply. The second protective MOSFET is connected between ground and the outside input terminal.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1A:
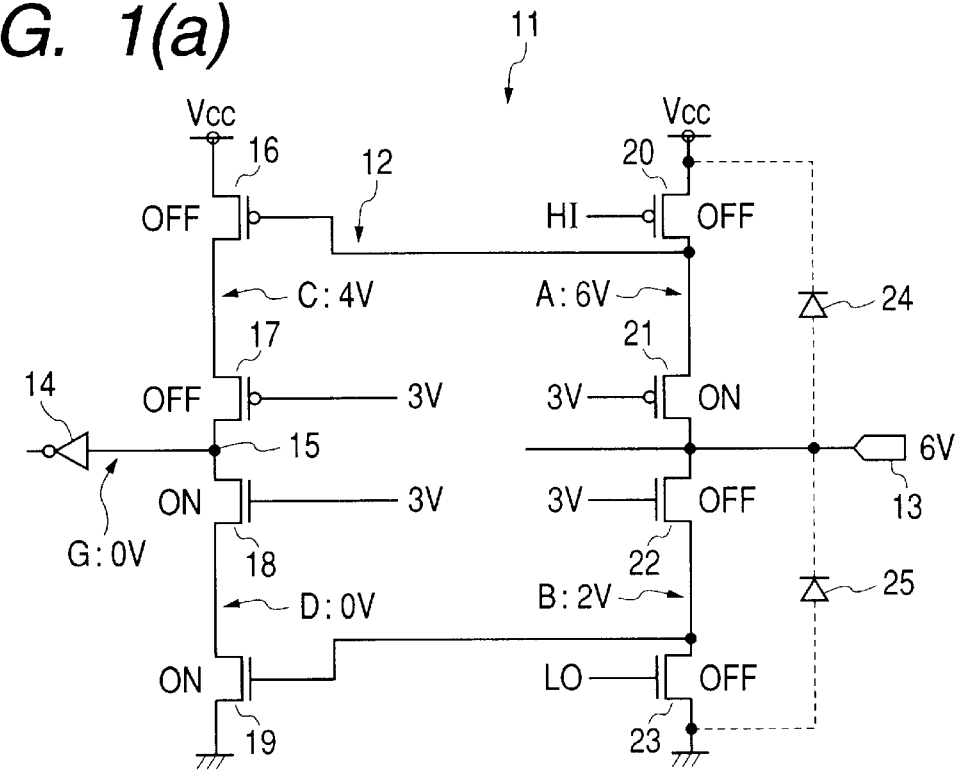
FIGS. 1(a) and 1(b) are circuit block diagrams which show an input interface circuit for use in a semiconductor integrated circuit device according to the first embodiment of the invention.
Figure 1B:
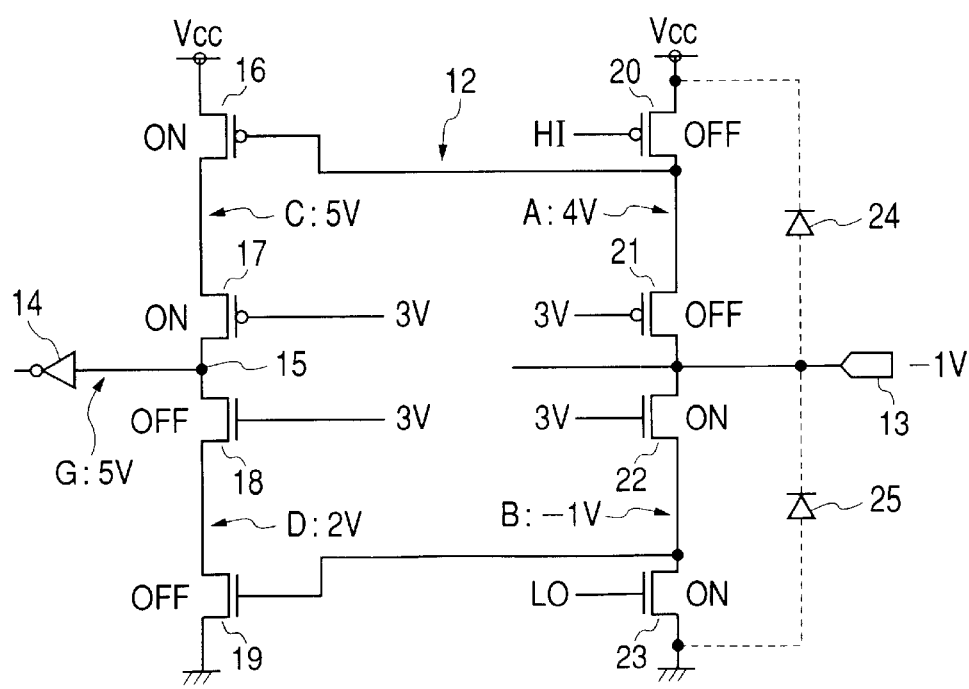

Referring to the drawings, wherein like reference numbers refer to like parts in several views, particularly to FIGS. 1(a) and 1(b), there is shown an input interface circuit 12 according to the first embodiment of the invention which is made of a CMOS logic and installed in a microcomputer 1 (i.e., a semiconductor integrated circuit device). FIG. 1(a) illustrates for the case where a high positive voltage is applied to the input interface circuit 12. FIG. 1(b) illustrates for the case where a high negative voltage is applied to the input interface circuit 12.

A signal outputted from an external device is inputted to an outside input terminal 13 of the microcomputer 11 and then transmitted to an inside input terminal 15 of an inverter 14 which is an internal element of the microcomputer 11.

P-channel MOSFETs 16 and 17 are disposed in series between a power supply Vcc and the input terminal 15. N-channel MOSFETs 18 and 19 are disposed in series between the input terminal 15 and ground.

P-channel MOSFETs 20 and 21 are disposed in series between the power supply Vcc and the input terminal 13. N-channel MOSFETs 22 and 23 are disposed in series between the input terminal 13 and ground.

A parasitic diode 24 is provided between the power supply Vcc and the input terminal 13 by the formation of the FETs 20 and 21 on a semiconductor substrate. A parasitic diode 25 is provided between the input terminal 13 and ground by the formation of the FETs 22 and 23 on the semiconductor substrate. A high level signal is given to a gate of the FET 20 at all times, while a low level signal is given to a gate of the FET 23 at all times (when they are used as input interfaces).

A gate of the FET 16 is connected to a junction of the FETs 20 and 21 which will also be referred to as a point A below. A gate of the FET 19 is connected to a junction of the FETs 22 and 23 which will also be referred to as a point B below. The voltage of the power supply Vcc is 5V. An intermediate voltage VM of 3V which is intermediate between ground potential and the voltage of the power supply Vcc is applied to the gates of the FETs 17, 18, 21, and 22. The intermediate voltage VM is produced from the power supply Vcc as a power source for operating core components of the microcomputer 11 which are designed to work on 3V (actually, 3.3V).

In the following discussion, a junction of the FETs 16 and 17 and a junction of the FETs 18 and 19 will also be referred to as points C and D, respectively, and the input terminal 15 will also be referred to as a point G. Portions of the input interface circuit 12 including the points A to D will also be referred to below as lines A to D, respectively.

An operation of the input interface circuit 12 when a high positive voltage is inputted to the input terminal 13 will be described below. FIG. 1(a) illustrates an on-off state of each FET and potentials at the lines A to D of the input interface circuit 12. The input high voltage is clamped at 6V (=power supply voltage+VF). Note that VF indicates the forward voltage of the diodes 24 and 25 and is assumed to be 1V in this embodiment for the sake of simplicity of explanation.

The operation during a transitional increase in potential at the input terminal 13 will be discussed below. During a time when the potential appearing at the input terminal 13 is within 0V to 2V (=VM−VF), the FET 22 is kept turned on. The potential developed at the input terminal 13 is, thus, applied to the gate of the FET 19. When the gate potential is elevated over 1V (i.e., VF), the FET 19 is turned on to turn on the FET 18. When the potential at the input terminal 13 reaches 2V, it will cause the FET 22 to be turned off, so that a line including the point B is placed in a high-impedance state, and the gate of the FET 19 is kept at 2V. The FETs 18 and 19 are, therefore, kept turned on.

During the interval in which the potential at the input terminal 13 is within 0V to 4V (=VM+VF), the FET 21 is kept turned off. When the potential reaches 4V, the FET 21 is turned on, so that the potential developed at the input terminal 13 is applied to the gate of the FET 16. The FET 16 is kept turned on until the gate voltage thereof reaches 4V (=Vcc−VF), so that the voltage Vcc of the power supply (i.e., 5V) is supplied to a power supply side terminal (i.e., the point C) of the FET 17. At this time, the FET 19 is in the on-state, so that 5V is applied to the input terminal 15 (i.e., the point. G).

When the potential at the input terminal 13 is elevated over 4V (=Vcc−VF), it will cause the FET 16 to be turned off, so that the potential at the point C drops below 5V. When the potential at the point C decreases below 4V (=VM+VF), it will cause the FET 17 to be turned off. When the potential at the input terminal 13 reaches 6V (=Vcc+VF), the gate of the FET 16 will be equal in potential to the input terminal 13, but the state of the FET 16 remains unchanged. Specifically, the FETs 16 and 17 are turned off, while the FETs 18 and 19 are turned on, so that the potential developed at the input terminal 15 (i.e., the point G) will be zero (0V).

An ultimate voltage to be applied to an oxide layer of the gate of each FET will be as follows:

FET 16: gate-to-drain 6V−4V=2V, gate-to-source 6V−5V=1V
FET 17: a gate-to-drain 3V−0V=3V, gate-to-source 4V−3V=1V
FET 18: 3V−0V=3V
FET 19: 2V−0V=2V
FET 20: 6V−5V=1V
FET 21: 6V−3V=3V
FET 22: gate-to-source 6V−3V=3V, gate-to-drain 3V−2V=1V
FET 23: gate-to-drain 2V−0V=2V, gate-to-source 0V−0V=0V Specifically, when the potential at the input terminal 13 reaches 6V, the FETs 16, 17, and 22 are turned off; however, the potentials at the power supply side terminal (i.e., the point C) of the FET 17 and at the ground side terminal (i.e., the point B) of the FET 22 are kept at levels defined by differences between them and the intermediate potential appearing at the gates thereof, thereby resulting in decreases in potential difference between the electrically discrete portions of the input interface circuit 12.

An operation of the input interface circuit 12 when a low negative voltage is inputted to the input terminal 13 will be described below. FIG. 1(b) illustrates an on-off state of each FET and potentials appearing at the lines A to D of the input interface circuit 12. The high negative voltage inputted to the input terminal 13 is clamped at −1V by activities of the diode 25. The operation during a transitional decrease in voltage applied to the input terminal 13 from the normal level will be discussed below.

When the potential appearing at the input terminal 13 decreases from 5V (i.e., Vcc) toward 0V, it will cause the potential at the point A, that is, the gate potential of the FET 16 to drop. When the gate potential of the FET 16 decreases to 4V (Vcc−VF), the FET 16 is turned on, so that 5V is applied to the power supply side terminal (i.e., the point C) of the FET 17. This causes the FET 17 to be turned on. Simultaneously, the FET 21 is turned off, so that the line A will be placed in the high impedance state. Thus, the gate potential of the FET 16 is kept at 4V (=Vcc−VF). The FETs 16 and 17 continue to be turned on.

The FET 22 is turned on when the potential at the input terminal 13 decreases below 2V (=VM−VF). The potential at the input terminal 13 is, thus, applied to the gate of the FET 19, so that it is turned on. When the potential at the input terminal 13 decreases below 1V (=VF), the FET 19 is turned off, so that the potential appearing at the side of the input terminal 15 increases from zero (0V). When this potential reaches 2V, it will cause the FET 18 to be turned off. When the potential at the input terminal 13 decreases to −1V (=−VF), the gate potential of the FET 19 will be −1V (=−VF), so that the FETs 16 and 17 are turned on, while the FETs 18 and 19 are turned off, thus causing the potential at the input terminal 15 to be 5V (=Vcc).

An ultimate voltage to be applied to an oxide layer of the gate of each FET will be as follows:
FET 16: 5V−4V=1V
FET 17: 5V−3V=2V
FET 18: gate-to-source 5V−3V=2V, gate-to-drain 3V−2V=1V
FET 19: gate-to-source 2V+1V=3V, gate-to-drain 1V−0V=1V
FET 20: gate-to-drain 5V−4V=1V, gate-to-source 5V−5V=0V
FET 21: gate-to-drain 3V+1V=4V, gate-to-source 4V−3V=1V
FET 22: 3V+1V=4V
FET 23: 0V+1V=1V Specifically, when the potential at the input terminal 13 drops to −1V, the FETs 18, 19, and 21 are turned off, however, the potentials at the input terminal side (i.e., the point D) of the FET 19 and at the power supply side (i.e., the point A) of the FET 21 are kept at levels established by differences between them and the intermediate potential appearing at the gates thereof, thereby resulting in decreases in potential difference between the electrically discrete portions of the input interface circuit 12.

As apparent from the above discussion, when the higher positive or negative voltage is inputted to the input terminal 13, it is clamped at 6V or −1V through the diodes 24 and 25. The intermediate voltage is applied to the gate of each of the FETs 17, 18, 21, and 22 to turn on and off it as a function of a difference in potential between the gate and source thereof. The FETs 21 and 22 are connected in series in order to apply the potential developed at the input terminal 13 to the gates of the FETs 16 and 19.

Specifically, even when the higher negative or positive voltage is inputted to the input terminal 13, a voltage higher than the voltage of the power supply Vcc (i.e., 5V) is not applied to the oxide layer of the gate of each FET, thus eliminating the need of an additional production process of increasing the thickness of an oxide layer of the gate.

The diodes 24 and 25 are provided by parasitic components of the FETs 20 and 21 and the FETs 22 and 23, respectively, thus eliminating the need for forming additional diodes on the substrate in a case where the whole of the microcomputer 1 is made of a CMOS logic. The use of the FETs 21 and 22 in forming the diodes 24 and 25 also results in a decrease in overall size of the circuit 12.

The above structure, as viewed from another angle, enables an input interface circuit into which a constant voltage signal is inputted to be made up of FETs which are relatively lower in ability to withstand the input of the constant voltage. For instance, proper adjustment of the intermediate voltage allows an input interface circuit into which a signal of 5V is inputted from an external device to be made up of FETs capable of withstanding application of 3.3V or an input interface circuit into which a signal of 3.3V is inputted to be made up of FETs capable of withstanding application of 2.5V. Specifically, the input interface circuit 12 of this embodiment may also be utilized effectively in a semiconductor integrated circuit device into which a higher voltage signal is hardly inputted.

Figure 2A:
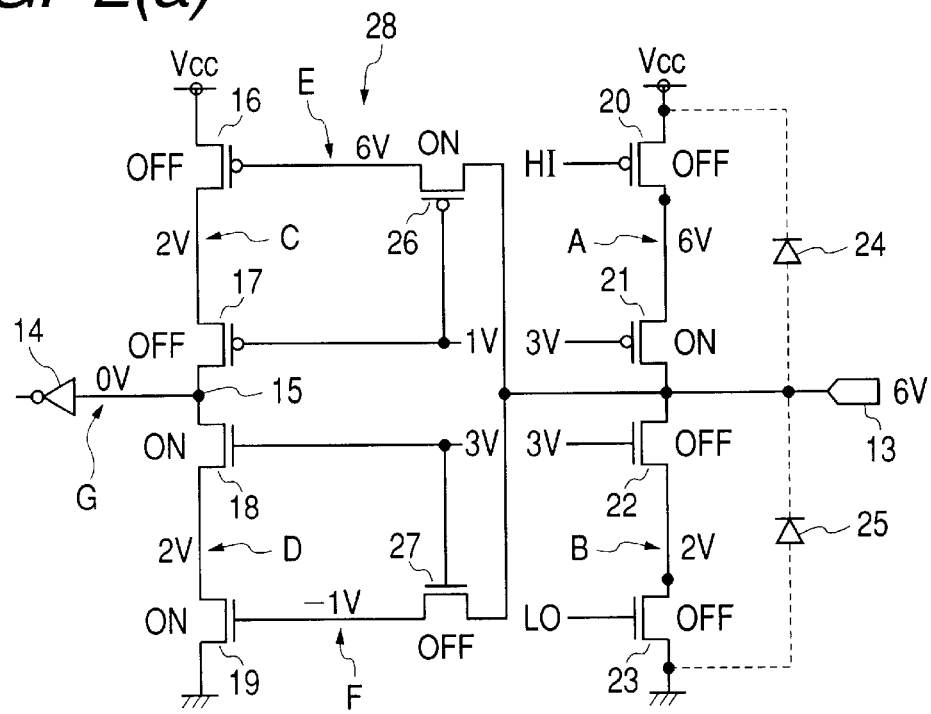
FIGS. 2(a) and 2(b) are circuit block diagrams which show an input interface circuit according to the second embodiment of the invention.
Figure 2B:
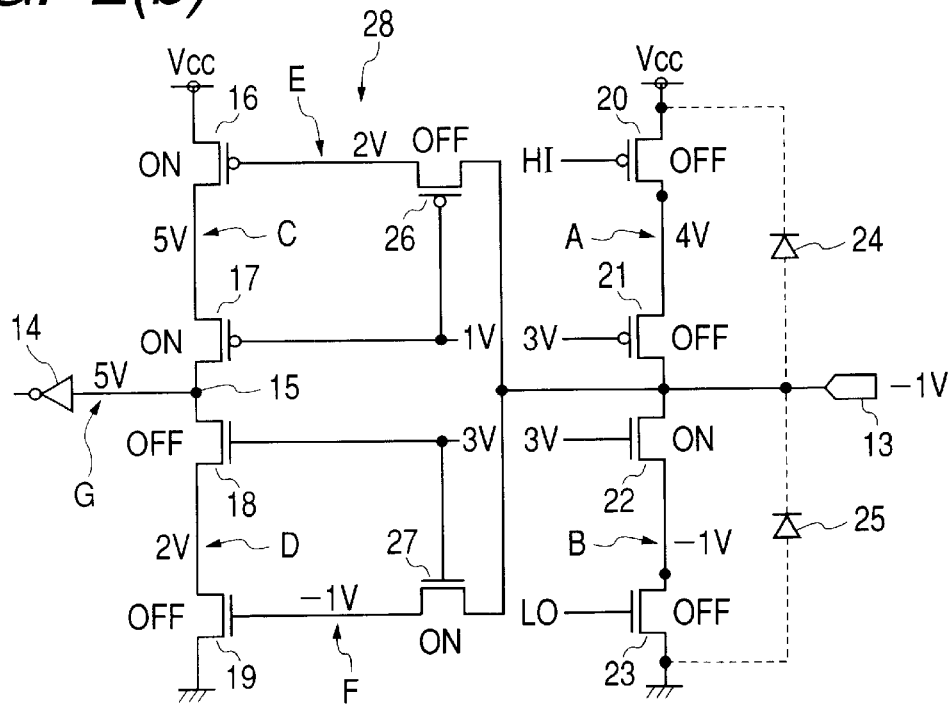

FIGS. 2(a) and 2(b) show an input interface circuit 28 according to the second embodiment of the invention. The same reference numbers as employed in FIGS. 1(a) and 1(b) refer to the same parts, and explanation thereof in detail will be omitted here.

The gate of the FET 16 is separate electrically from the power supply side terminal of the FET 21. Between the input terminal 13 and the gate of the FET 16, a P-channel MOSFET 26 is disposed in series. Similarly, the gate of the FET 19 is separate electrically from the ground terminal of the FET 22. Between the input terminal 13 and the gate of the FET 19, an N-channel MOSFET 27 is disposed in series.

An intermediate voltage of 3V is applied to the gates of the FETs 27 and 18, while an intermediate voltage of 1V is applied to the gates of the FETs 26 and 17. Other arrangements are identical with those of the input interface circuit 12 of the first embodiment.

In the structure of this embodiment, the FETs 21 and 22 are only used as a protection circuit provided at the first stage of the input interface circuit 28. The FETs 26 and 27 are provided to perform the same functions as that of the FETs 21 and 22 in the first embodiment.

An intermediate voltage of 1V lower than 3V is, as described above, applied to the gates of the FETs 17 and 26. Source voltages of the FETs 17 and 16 at which they are turned on and off are different from those in the first embodiment. The potentials kept at lines placed in the high impedance state on the side of the power supply Vcc are different from those in the first embodiment.

Specifically, in a case where a higher positive voltage is, as shown in FIG. 2(a), applied to the input terminal 13 and clamped at 6V, the FET 26 is turned on when the potential developed at the input terminal 13 increases over 2V, so that 6V is applied to the gate of the FET 16 (i.e., the point E). When the FET 17 is turned off ultimately, the potential appearing at the power supply side terminal of the FET 17 will be 2V. In a case where a higher negative voltage is, as shown in FIG. 2(b), applied to the input terminal 13 and clamped at −1V, when the FET 26 is turned off, the potential appearing at the gate of the FET 16 (i.e., the point F) will be 2V. Specifically, the FET 16 in the first embodiment is kept turned on when the difference between the potential at the gate thereof and the voltage of the power supply (5V) is 1V, while the FET 16 in the second embodiment is kept turned on when that difference is 3V. It is, thus, possible to turn on the FET 16 with high reliability.

Figure 3:
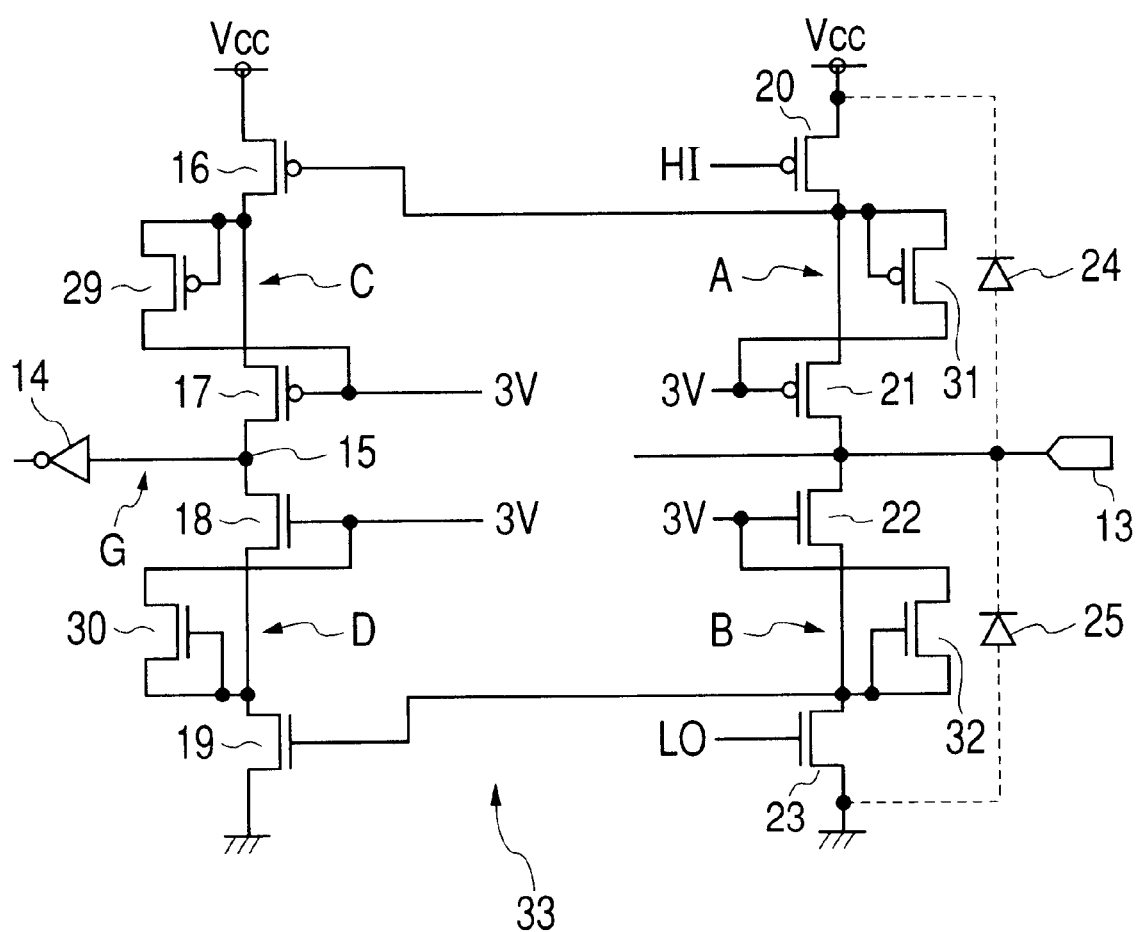
FIG. 3 is a circuit block diagram which shows an input interface circuit according to the third embodiment of the invention.

FIG. 3 shows an input interface circuit 33 according to the third embodiment of the invention. The same reference numbers as employed in the first embodiment refer to the same parts, and explanation thereof in detail will be omitted here.

The input interface circuit 33 includes a P-channel MOSFET 29, an N-channel MOSFET 30, a P-channel MOSFET 31, and an N-channel MOSFET 32. The FET 29 is connected at a source and a gate thereof to a junction of the FETs 16 and 17 and at a drain thereof to the gate of the FET 17. The FET 30 is connected at a source and a gate thereof to a junction of the FETs 18 and 19 and at a drain thereof to the gate of the FET 18.

The FET 31 is connected at a drain and a gate thereof to a junction of the FETs 20 and 21 and at a source thereof to the gate of the FET 21. The FET 32 is connected at a drain and a gate thereof to a junction of the FETs 22 and 23 and at a source thereof to the gate of the FET 23.

In operation, when the surge voltage is applied directly to lines which are placed in the high impedance state, so that charges are added to the lines, and the voltages developed at the lines are elevated, the FETs 29, 30, 31, and 32 each work to clamp the voltages.

Specifically, in the input interface circuit 12 of the first embodiment, when a high positive voltage is, as shown in FIG. 1(a), applied to the input terminal 13, it will cause the FETs 16, 17, 22, and 23 to be turned off, so that both the line C and the line B will be in the high impedance state. If, in such a condition, a positive surge voltage is applied directly to the line B to add charges thereto, the potential developed at the line B is elevated undesirably, which may cause the FETs 19, 22, and 23 to be broken. If a negative surge voltage is applied to the line C, so that charges are added thereto, the potential developed at the line C is elevated in the negative direction, which may cause the FETs 16 and 17 to be broken.

Similarly, when a high negative voltage is, as shown in FIG. 1(b), applied to the input terminal 13, it will cause the FETs 18, 19, 20, and 21 to be turned off, so that both the line D and the line A will be in the high impedance state. If, in such a condition, a negative surge voltage is applied directly to the line A, so that charges are added thereto, the potential developed at the line A is elevated in the negative direction, which may cause the FETs 16, 20, and 21 to be broken. Additionally, if a positive surge voltage is applied to the line D, so that charges are added thereto, the potential developed at the line D is elevated in the positive direction, which may result in breakage of the FETs 18 and 19.

Further, charges may leak to the lines placed in the high impedance state, thereby causing the voltages thereat to be increased or decreased undesirably.

In order to avoid the above problems, the input interface circuit 33 of the third embodiment is designed to turned on the FET 32 when the potential at the line including the point B is elevated over 3V plus VF to form a line serving to have the charges escape to the supply side of the intermediate voltage of 3V, thereby clamping the potential at 4V. Additionally, when the potential at the line including the point C decreases below 3V minus VF, the FET 29 is turned on to clamp it at 2V.

When the potential at the line including the point A drops below 3V minus VF, the FET 31 is turned on to clamp it at 2V. When the potential at the line including the point D is elevated over 3V plus VF, the FET 30 is turned on to clamp it at 4V.

As apparent from the above discussion, the FETs 29 to 32 working as protection elements are coupled with the lines A, B, C, and D which may be brought into the high impedance state by turning off of pairs of the FETs 16 and 17, the FETs 18 and 19, the FETs 20 and 21, and the FETs 21 and 22 connected in series to avoid the breakage of the FETs 16 to 23.

Figure 4:
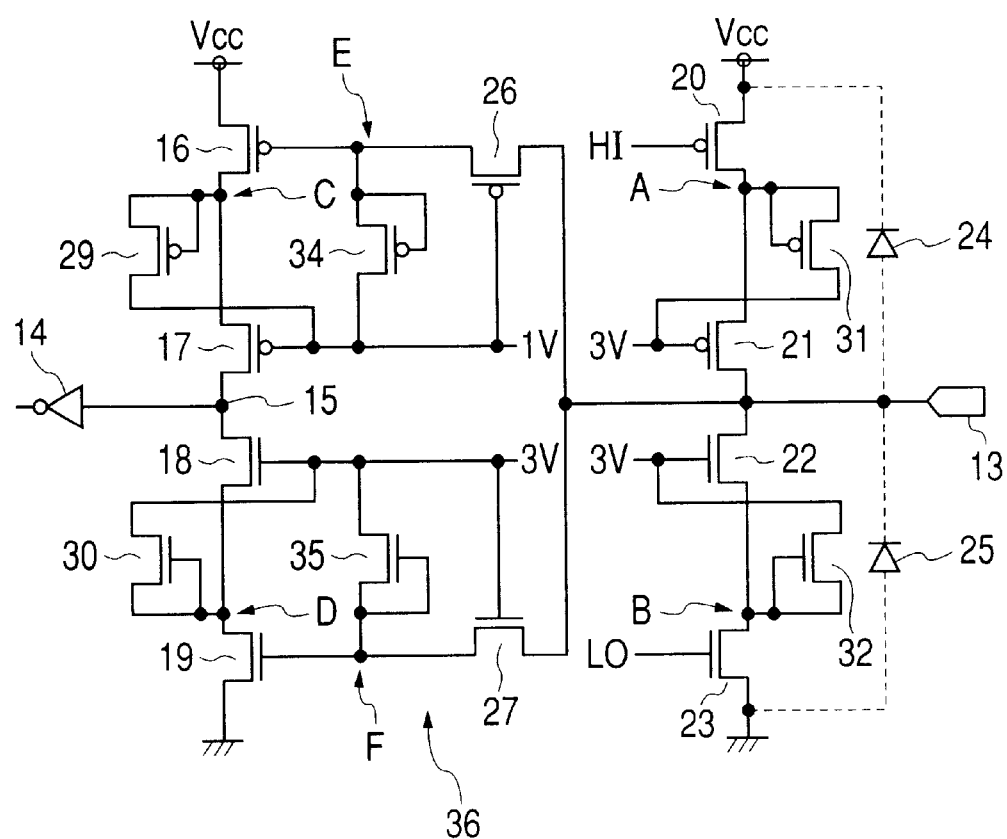
FIG. 4 is a circuit block diagram which shows an input interface circuit according to the fourth embodiment of the invention.
Figure 5:
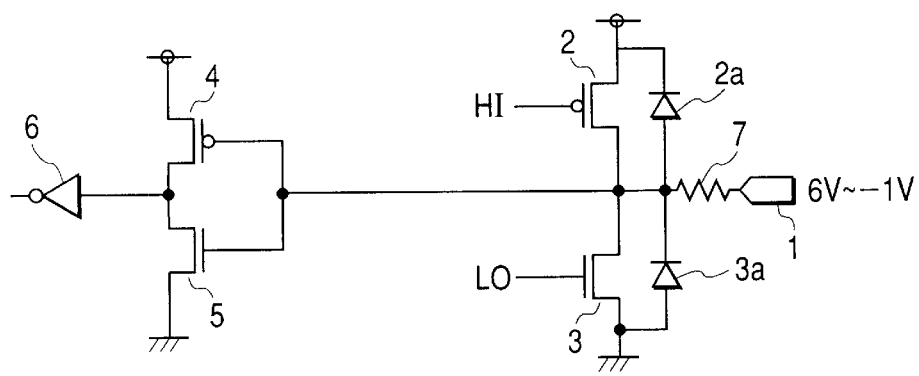
FIG. 5 is a block diagram which shows a conventional input interface circuit for a semiconductor integrated circuit device.
Figure 6A:
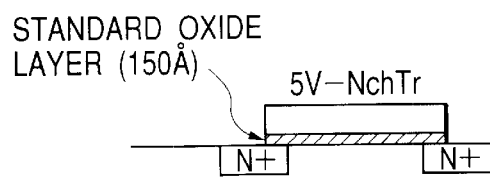
FIG. 6(a) illustrates the thickness of an oxide layer of a gate of a typical FET.
Figure 6B:
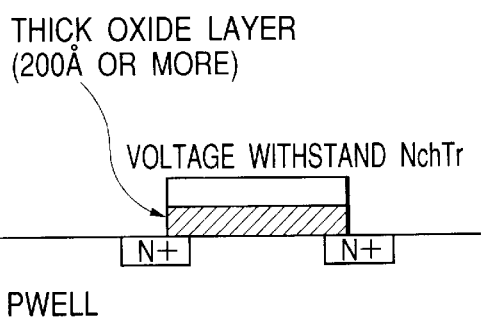
FIG. 6(b) illustrates the thickness of an oxide layer of a gate of a conventional voltage-withstanding FET.

FIG. 4 shows an input interface circuit 36 according to the fourth embodiment of the invention which is a modification of a combination of the structures in the second and third embodiments. The same reference numbers as employed in the above embodiments refer to the same parts, and explanation thereof in detail will be omitted here.

The input interface circuit 36 includes a P-channel MOSFET 34 and an N-channel MOSFET 35. The FET 34 is coupled at a drain and a gate thereof to the gate of the FET 16 and at a source to the gate of the FET 17. The FET 35 is coupled at a drain and a gate thereof to the gate of the FET 19 and at a source to the gate of the FET 18. Other arrangements are identical with those in the second and third embodiments.

In the input interface circuit 28 of the second embodiment, when the FETs 26 and 27 are turned off, the lines E and F are placed in the high impedance state. Therefore, as shown in FIG. 2(a), in a case where a positive surge voltage is applied to the input terminal 13, thereby causing the FET 27 to be turned off, so that the line F is placed in the high impedance state, if a positive surge voltage is applied to the line F to add charges thereto, it will cause the potential at the line F to be elevated undesirably, which may cause the damage to the FETs 19 and 27.

Similarly, as shown in FIG. 2(b), in a case where a negative surge voltage is applied to the input terminal 13, thereby causing the FET 26 to be turned off, so that the line E is placed in the high impedance state, if a negative surge voltage is applied to the line E to add charges thereto, it will cause the potential at the line E to be elevated undesirably in the negative direction, which may cause the damage to the FETs 16 and 26.

In order to avoid the above problems, the input interface circuit 36 of this embodiment is designed to turn on the FET 35 when the potential appearing at the line F exceeds 4V to form a line serving to have the charges escape to the supply side of the intermediate voltage of 3V, thereby clamping the potential at the line F at 4V. Additionally, when the potential at the line E decreases below 0V, the FET 34 is turned on to clamp the potential at the line E at 0V.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

For example, in the second embodiment, the intermediate voltage to be applied to the gate of the FET 21 may be 1V. Similarly, the intermediate voltage to be applied to the gates of the FETs 17 and 21 in the first embodiment may be 1V.

In the second embodiment, the intermediate voltage to be applied to the gates of the FETs 17 and 21 may be 3V.

The parasitic diodes 24 and 25 provided by the MOSFETS 20 to 23 may alternatively be replaced by independent elements.

The intermediate voltages VM is not limited to 1V or 3V, but may be set to a value falling within a range of (0V+VF)≦VM≦(Vcc-VF).

When it is required to use the input terminal 13 as an input/output terminal, an output signal produced by internal components of the microcomputer 11 may be given to the gates of the FETs 20 and 23 to use them as output transistors.

What is claimed is:

1. An input interface circuit for a semiconductor integrated circuit device comprising:
   a pair of diodes provided between a power supply and an outside input terminal and between the outside input terminal and ground, respectively;
   a first and a second PMOSFET connected in series between the power supply and an inside input terminal coupled to an internal circuit element of the semiconductor integrated circuit device;
   a first and a second NMOSFET connected in series between ground and the inside input terminal;
   a third PMOSFET connected in series between the outside input terminal and a gate of said first PMOSFET;
   a third NMOSFET connected in series between said outside input terminal and a gate of said second NMOSFET; and
   an intermediate voltage source applying a voltage which is between ground potential and a voltage of said power supply to a gate of each of said first NMOSFET, said second PMOSFET, said third PMOSFET, and said third NMOSFET.

2. An input interface circuit as set forth in claim 1, wherein said two diodes are parasitic diodes provided by said third NMOSFET and the third PMOSFET.

3. An input interface circuit as set forth in claim 1, further comprising a fourth PMOSFET connected in series with said third PMOSFET between said outside input terminal and said power supply and a fourth NMOSFET connected in series with said third NMOSFET between said outside input terminal and ground, said fourth PMOSFET and NMOSFET being kept turned off, and wherein said two diodes are implemented by a parasitic diode coupled in series with said third and fourth PMOSFETs and a parasitic diode coupled in series with said third and fourth NMOSFETs.

4. An input interface circuit for a semiconductor integrated circuit device comprising:
   a power supply;
   an outside input terminal for receiving an external signal to be processed;
   an inside input terminal for receiving a processed signal;
   a first and a second PMOSFET connected in series between a power supply and the inside input terminal;
   a third PMOSFET connected in series between the outside input terminal and a gate of said first PMOSFET;
   a first and a second NMOSFET connected in series between ground and the inside input terminal;
   a third NMOSFET connected in series between said outside input terminal and a gate of said second NMOSFET; and
   an intermediate voltage source applying a voltage which is between ground potential and a voltage of said power supply to a gate of each of said first NMOSFET, said second PMOSFET, said third PMOSFET and said third NMOSFET.

5. An input interface circuit as set forth in claim 4, wherein said third PMOSFET and said third NMOSFET each provide for a parasitic diode.

* * * * *